US012341551B2

(12) United States Patent
Tahara et al.

(10) Patent No.: US 12,341,551 B2
(45) Date of Patent: Jun. 24, 2025

(54) HIGH-FREQUENCY CIRCUIT AND COMMUNICATION DEVICE

(71) Applicant: Murata Manufacturing Co., Ltd., Kyoto (JP)

(72) Inventors: Kenji Tahara, Kyoto (JP); Seikoh Ono, Kyoto (JP); Kiyoshi Aikawa, Kyoto (JP); Masanari Miura, Kyoto (JP); Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 425 days.

(21) Appl. No.: 18/056,816

(22) Filed: Nov. 18, 2022

(65) Prior Publication Data

US 2023/0079361 A1 Mar. 16, 2023

Related U.S. Application Data

(63) Continuation of application No. PCT/JP2021/024561, filed on Jun. 29, 2021.

(30) Foreign Application Priority Data

Jul. 16, 2020 (JP) .................... 2020-122342

(51) Int. Cl.
  *H04B 1/44* (2006.01)
  *H03H 7/01* (2006.01)
(52) U.S. Cl.
  CPC ............. *H04B 1/44* (2013.01); *H03H 7/0115* (2013.01); *H03H 2007/013* (2013.01)

(58) Field of Classification Search
  CPC ..................... H04B 1/44; H03H 7/0115
  See application file for complete search history.

(56) References Cited

U.S. PATENT DOCUMENTS

2004/0266378 A1  12/2004  Fukamachi et al.
2015/0373711 A1  12/2015  Narathong et al.
2020/0091894 A1*  3/2020  Nakahashi ............. H03H 9/703
(Continued)

FOREIGN PATENT DOCUMENTS

CN    110401421 A    11/2019
JP    2003-133989 A    5/2003
(Continued)

OTHER PUBLICATIONS

International Search Report for PCT/JP2021/024561 dated Oct. 5, 2021.

*Primary Examiner* — David Bilodeau
(74) *Attorney, Agent, or Firm* — McDonald Hopkins LLC

(57) ABSTRACT

A high-frequency circuit includes: a diplexer that is composed of a filter which has a pass band including a first frequency band group and a filter which has a pass band including a second frequency band group; a notch filter that is connected with the filter and whose stop band is a frequency band which is not included in a first communication band; a notch filter that is connected with the filter and whose stop band is a frequency band which is not included in a second communication band; and switches that are connected with the notch filters. A band pass filter whose pass band is the first communication band and a band pass filter whose pass band is the second communication band are not connected between the filter and the switches.

13 Claims, 4 Drawing Sheets

(56) References Cited

U.S. PATENT DOCUMENTS

2020/0136227 A1* 4/2020 Ishihara .............. H04B 1/0053
2020/0195295 A1   6/2020 Kondo et al.
2020/0343930 A1* 10/2020 DiTommaso ........... H04B 1/44
2021/0067186 A1* 3/2021 Beaudin ................ H04B 1/401

FOREIGN PATENT DOCUMENTS

JP      2017-527155 A    9/2017
JP      2020-96313 A     6/2020

* cited by examiner

HIGH-FREQUENCY CIRCUIT AND COMMUNICATION DEVICE

CROSS REFERENCE TO RELATED APPLICATION

This is a continuation of International Application No. PCT/JP2021/024561 filed on Jun. 29, 2021 which claims priority from Japanese Patent Application No. 2020-122342 filed on Jul. 16, 2020. The contents of these applications are incorporated herein by reference in their entireties.

BACKGROUND ART

Technical Field

The present disclosure relates to a high-frequency circuit and a communication device.

Background Art

A communication band for time division duplex (TDD) (hereinafter, simply referred to also as a TDD band) which has a wider bandwidth can be used in 5th generation new radio (5GNR), and efficient use of such a broad TDD band has been studied.
Patent Document 1: Japanese Unexamined Patent Application Publication (Translation of PCT Application) No. 2017-527155

BACKGROUND ART

However, when transmitting signals of a plurality of TDD bands with low loss in a conventional high-frequency circuit, the conventional high-frequency circuit is composed of an antenna multiplexer which divides or combines signals of a frequency band group, to which the plurality of TDD bands belong, with signals of other frequency band groups, and a plurality of band pass filters whose pass bands are respective TDD bands, which makes the circuit configuration more complex and larger.

Therefore, the present disclosure will provide a high-frequency circuit and a communication device that are simplified and reduced in size and that are capable of transmitting signals of a plurality of mutually-different TDD bands with low loss.

A high-frequency circuit according to an aspect of the present disclosure includes: a first multiplexer that is composed of a first filter which has a pass band including a first frequency band group which includes a first communication band for time division duplex (TDD) and a second communication band for TDD, and a second filter which has a pass band including a second frequency band group whose frequency does not overlap with a frequency of the first frequency band group; a first band rejection filter that is connected with the first filter and whose stop band is a frequency band which is not included in the first communication band; a second band rejection filter that is connected with the first filter and whose stop band is a frequency band which is not included in the second communication band; and a first switching circuit that is connected between the first band rejection filter and a first transmission input terminal for receiving a first transmission signal from an outside and between the first band rejection filter and a first reception output terminal for outputting a first reception signal to an outside, and is connected between the second band rejection filter and a second transmission input terminal for receiving a second transmission signal from an outside and between the second band rejection filter and a second reception output terminal for outputting a second reception signal to an outside. A band pass filter whose pass band is the first communication band and a band pass filter whose pass band is the second communication band are not connected between the first filter and the first switching circuit.

According to the present disclosure, a high-frequency circuit and a communication device that are simplified and reduced in size and that are capable of transmitting signals can be provided.

DETAILED DESCRIPTION

Figure 1:
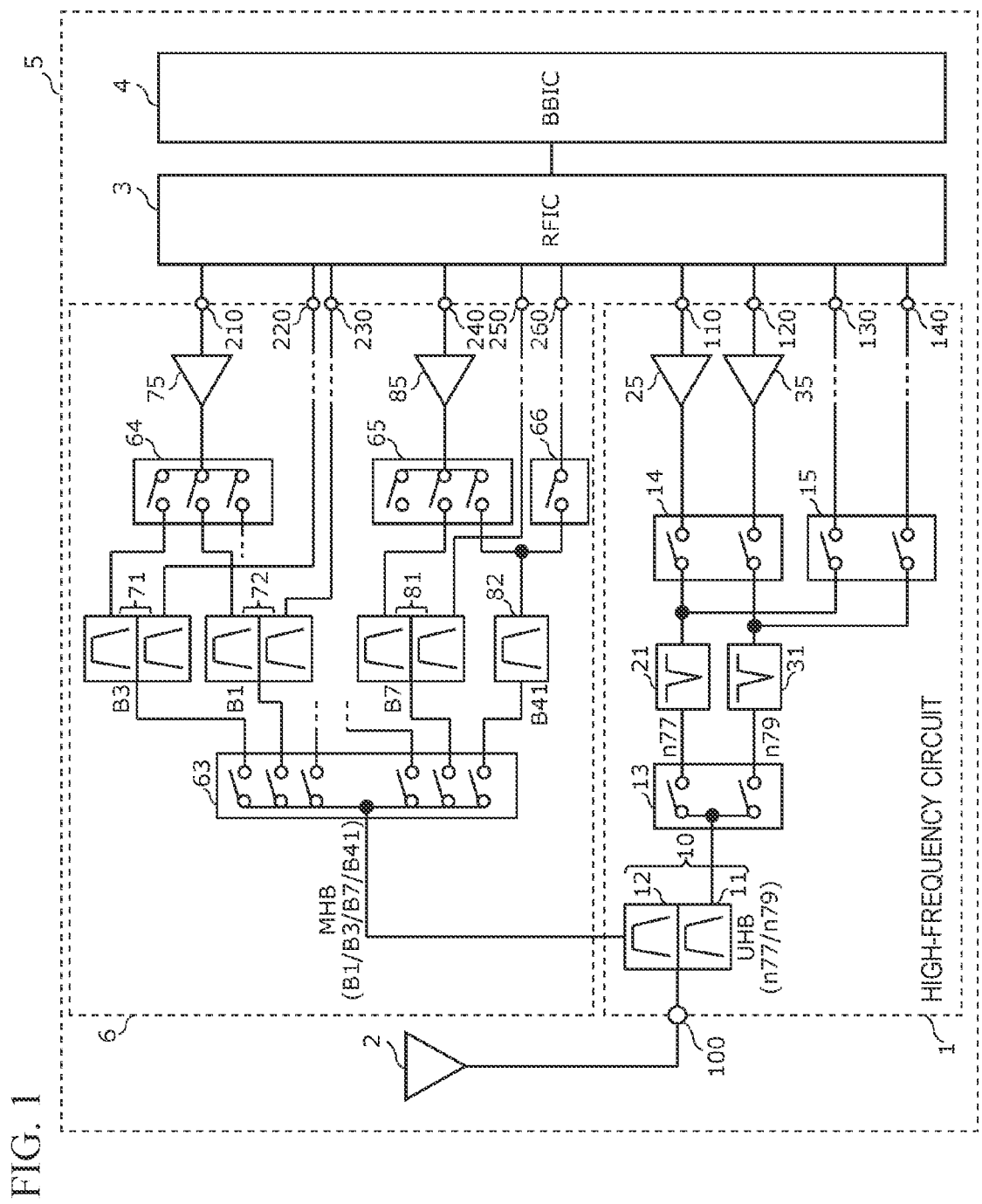
FIG. 1 is a circuit configuration diagram of a high-frequency circuit and a communication device according to a first embodiment.

Embodiments according to the present disclosure will be described in detail below with reference to the accompanying drawings. All of the embodiments described below are comprehensive or specific examples. Numerical values, shapes, materials, components, arrangement and connection forms of the components, and the like shown in the following embodiments are examples, and are not intended to limit the present disclosure.

Each drawing is a schematic diagram to which emphasis, omission, or proportion adjustment is applied as appropriate to illustrate the disclosure. Thus, each drawing is not necessarily a strict illustration and may differ from the actual shapes, positioning, and proportions. In each drawing, the same reference characters are applied to substantially identical configurations and redundant description may be omitted or simplified.

In addition, in circuit configurations of the present disclosure, "connected" includes not only direct connection with connection terminals and/or wiring conductors, but also electrical connection via other circuit elements. Also, "connected between A and B" means being connected to both A and B between A and B.

First Embodiment

[1.1 Circuit Configurations of High-Frequency Circuit 1 and Communication Device 5]

Circuit configurations of a high-frequency circuit 1 and a communication device 5 according to the present embodiment will be described with reference to FIG. 1. FIG. 1 is a circuit configuration diagram of the high-frequency circuit 1 and the communication device 5 according to a first embodiment.

[1.1.1 Circuit Configuration of Communication Device 5]

The circuit configuration of the communication device 5 will be first described. As illustrated in FIG. 1, the communication device 5 according to the present embodiment includes high-frequency circuits 1 and 6, an antenna 2, an RF signal processing circuit (RFIC) 3, and a baseband signal processing circuit (BBIC) 4.

The high-frequency circuits 1 and 6 transmit high-frequency signals between the antenna 2 and the RFIC 3. The circuit configurations of the high-frequency circuits 1 and 6 will be detailed later.

The antenna 2 is connected with an antenna connection terminal 100 of the high-frequency circuit 1. The antenna 2 transmits a high-frequency signal outputted from the high-frequency circuit 1, and also receives a high-frequency signal from the outside and outputs the high-frequency signal to the high-frequency circuit 1.

The RFIC 3 is an example of a signal processing circuit that processes a high-frequency signal. Specifically, the RFIC 3 processes high-frequency reception signals, inputted via reception paths of the high-frequency circuits 1 and 6, by down-conversion or the like and outputs the reception signals generated by this signal processing to the BBIC 4. Also, the RFIC 3 processes transmission signals, inputted from the BBIC 4, by up-conversion or the like and outputs the high-frequency transmission signals generated by this signal processing to transmission paths of the high-frequency circuits 1 and 6. Further, the RFIC 3 includes a control unit that controls switches, amplifiers, and the like included in the high-frequency circuits 1 and 6. Here, part or all of the function as the control unit of the RFIC 3 may be mounted on the outside of the RFIC 3, and may be, for example, mounted on the BBIC 4, the high-frequency circuit 1, or the high-frequency circuit 6.

The BBIC 4 is a baseband signal processing circuit that processes a signal by using an intermediate frequency band which is lower in frequency than the high-frequency signal transmitted by the high-frequency circuits 1 and 6. Examples of a signal processed in the BBIC 4 include an image signal for displaying an image and/or an audio signal for calls through speakers.

In the communication device 5 according to the present embodiment, the antenna 2, the high-frequency circuit 6, and the BBIC 4 are optional components.

[1.1.2 Circuit Configuration of High-Frequency Circuit 1]

The circuit configuration of the high-frequency circuit 1 will now be described. As illustrated in FIG. 1, the high-frequency circuit 1 includes a diplexer 10, notch filters 21 and 31, switches 13, 14, and 15, power amplifiers 25 and 35, the antenna connection terminal 100, transmission input terminals 110 and 120, and reception output terminals 130 and 140.

The antenna connection terminal 100 is connected to the antenna 2.

The transmission input terminal 110 is an example of a first transmission input terminal and is a terminal for receiving a first transmission signal from the outside of the high-frequency circuit 1. Specifically, the transmission input terminal 110 is a terminal for receiving the first transmission signal of a first communication band for TDD from the RFIC 3.

The transmission input terminal 120 is an example of a second transmission input terminal and is a terminal for receiving a second transmission signal from the outside of the high-frequency circuit 1. Specifically, the transmission input terminal 110 is a terminal for receiving the second transmission signal of a first communication band for TDD from the RFIC 3.

The reception output terminal 130 is an example of a first reception output terminal and is a terminal for outputting a first reception signal to the outside of the high-frequency circuit 1. Specifically, the reception output terminal 130 is a terminal for supplying the first reception signal of the first communication band to the RFIC 3.

The reception output terminal 140 is an example of a second reception output terminal and is a terminal for outputting a second reception signal to the outside of the high-frequency circuit 1. Specifically, the reception output terminal 130 is a terminal for supplying the first reception signal of the second communication band to the RFIC 3.

Here, the communication bands mean a frequency band predefined by a standards body (for example, 3rd Generation Partnership Project (3GPP) and Institute of Electrical and Electronics Engineers (IEEE)) or the like for communication systems. The communication systems mean communication systems built by using the radio access technology (RAT). Examples of the communication systems include 5GNR systems, long term evolution (LTE) systems, and wireless local area network (WLAN) systems, but the communication systems are not limited to these.

In the present embodiment, band n77 (bandwidth: 3300 to 4200 MHz) for 5GNR is used as the first communication band and band n79 (bandwidth: 4400 to 5000 MHz) for 5GNR is used as the second communication band. However, the combination of the first communication band and the second communication band is not limited to the combination of the band n77 and the band n79. For example, band n78 (bandwidth: 3300 to 3800 MHz) may be employed as the first communication band instead of the band n77. Also, the first communication band and the second communication band may be communication bands for mutually-different communication systems. For example, a combination including arbitrary two from frequency bands for 5GNR, LTE, and WLAN may be employed as the first communication band and the second communication band. Further, a millimeter wave band on and higher than 7 gigahertz may be employed as the first communication band and/or the second communication band.

The diplexer 10 is an example of a first multiplexer and includes filters 11 and 12. The filter 11 is an example of a first filter and is a filter that has a pass band including a first frequency band group. The first frequency band group includes the first communication band for time division duplex (TDD) and the second communication band for TDD. The filter 12 is an example of a second filter and is a filter that has a pass band including a second frequency band group whose frequency does not overlap with the frequency of the first frequency band group.

Here, the first multiplexer is not limited to a diplexer but may be a multiplexer that divides and/or combines three or more frequency band groups.

One terminal of the filter 11 and one terminal of the filter 12 are connected with the antenna connection terminal 100. The other terminal of the filter 11 is connected with the switch 13. The other terminal of the filter 12 is connected with a switch 63 of the high-frequency circuit 6.

In the present embodiment, the first frequency band group is, for example, an ultra-high band (3.3 to 5 GHz) and includes the bands n77 and n79 for 5GNR. The second frequency band group is, for example, a middle-high band (1.5 to 2.8 GHz) and includes band B1 (transmission bandwidth: 1920 to 1980 MHz, reception bandwidth: 2110 to 2170 MHz), band B3 (transmission bandwidth: 1710 to 1785 MHz, reception bandwidth: 1805 to 1880 MHz), band B7 (transmission bandwidth: 2500 to 2570 MHz, reception bandwidth: 2620 to 2690 MHz), and band B41 (bandwidth: 2496 to 2690 MHz) for 4GLTE.

The filter 11 is, for example, a high-pass LC filter including an ultra-high band as a pass band, and the filter 12 is, for example, a low-pass LC filter including a middle-high band as a pass band. When the first frequency band group is located on a lower frequency side than the second frequency band group, the filter 11 may be a low-pass LC filter and the filter 12 may be a high-pass LC filter.

Here, the LC filter is a filter whose pass band is formed by an inductor and a capacitor.

The notch filter 21 is an example of a first band rejection filter. The notch filter 21 is a band rejection filter that is connected with the filter 11 via the switch 13 and whose stop band is a frequency band which is not included in the first communication band. Further, the notch filter 21 uses a band on the lower frequency side and a band on the higher frequency side than the stop band as pass bands.

The notch filter 21 is, for example, an acoustic wave notch filter that is composed only of an acoustic wave resonator arranged on a serial arm path or a parallel arm path, or an LC filter that is composed only of an LC resonance circuit arranged on a parallel arm path. Here, the first band rejection filter may be a high-pass LC filter, or may be a low-pass LC filter, instead of the notch filter 21. The high-pass LC filter uses a frequency band on the lower frequency side than the first communication band as an attenuation band and uses the first communication band as a pass band. The low-pass LC filter uses a frequency band on the higher frequency side than the first communication band as an attenuation band and uses the first communication band as a pass band.

The notch filter 31 is an example of a second band rejection filter. The notch filter 31 is a band rejection filter that is connected with the filter 11 via the switch 13 and whose stop band is a frequency band which is not included in the second communication band. Further, the notch filter 31 uses a band on the lower frequency side and a band on the higher frequency side than the stop band as pass bands.

The notch filter 31 is, for example, an acoustic wave notch filter that is composed only of an acoustic wave resonator arranged on a serial arm path or a parallel arm path, or an LC filter that is composed only of an LC resonance circuit arranged on a parallel arm path. Here, the second band rejection filter may be a high-pass LC filter, or may be a low-pass LC filter, instead of the notch filter 31. The high-pass LC filter uses a frequency band on the lower frequency side than the second communication band as an attenuation band and uses the second communication band as a pass band. The low-pass LC filter uses a frequency band on the higher frequency side than the second communication band as an attenuation band and uses the second communication band as a pass band.

The switch 13 is an example of a second switching circuit. The switch 13 switches connection and disconnection between the filter 11 and the notch filter 21 and switches connection and disconnection between the filter 11 and the notch filter 31. The switch 13 includes a common terminal and two selection terminals. The common terminal is connected to the other terminal of the filter 11, one selection terminal is connected to one terminal of the notch filter 21, and the other selection terminal is connected to one terminal of the notch filter 31.

In this connection configuration, the switch 13 is capable of switching (1) connection between the filter 11 and the notch filter 21, (2) connection between the filter 11 and the notch filter 31, and (3) connection between the filter 11 and the notch filters 21 and 31 in response to, for example, a control signal from the RFIC 3. The switch 13 is composed of, for example, a multi-connection switching circuit.

The power amplifier 25 is an example of a first power amplifier and is connected between the switch 14 and the transmission input terminal 110. The power amplifier 25 is capable of amplifying the first transmission signal of the first communication band received in the transmission input terminal 110.

The power amplifier 35 is an example of a second power amplifier and is connected between the switch 14 and the transmission input terminal 120. The power amplifier 35 is capable of amplifying the second transmission signal of the second communication band received in the transmission input terminal 120.

For example, multi-stage amplifiers and/or differential amplifiers can be used as the power amplifiers 25 and 35, but the power amplifiers 25 and 35 are not limited to these.

The switch 14 is a part of a first switching circuit. The switch 14 is connected between the notch filter 21 and the power amplifier 25 and is connected between the notch filter 31 and the power amplifier 35.

In this connection configuration, the switch 14 switches connection and disconnection between the notch filter 21 and the power amplifier 25 and switches connection and disconnection between the notch filter 31 and the power amplifier 35 in response to, for example, a control signal from the RFIC 3. The switch 14 is composed of, for example, two single pole single throw (SPST) switches.

The switch 15 is a part of the first switching circuit. The switch 15 is connected between the notch filter 21 and the reception output terminal 130 and is connected between the notch filter 31 and the reception output terminal 140.

In this connection configuration, the switch 15 switches connection and disconnection between the notch filter 21 and the reception output terminal 130 and switches connection and disconnection between the notch filter 31 and the reception output terminal 140 in response to, for example, a control signal from the RFIC 3. The switch 15 is composed of, for example, two single pole single throw (SPST) switches.

Further, the switches 14 and 15 exclusively switch connection between the notch filter 21 and the power amplifier 25 and connection between the notch filter 21 and the reception output terminal 130, and exclusively switch connection between the notch filter 31 and the power amplifier 35 and connection between the notch filter 31 and the reception output terminal 140 in response to, for example, a control signal from the RFIC 3.

A set of the switches 14 and 15 is an example of the first switching circuit. The switches 14 and 15 function as a TDD switch that switches transmission and reception of the first communication band and switches transmission and reception of the second communication band.

In the high-frequency circuit 1 according to the present embodiment, a band pass filter whose pass band is the first communication band and a band pass filter whose pass band is the second communication band are not connected between the filter 11 and the switches 14 and 15.

Here, the high-frequency circuit 1 may include a low noise amplifier that is connected between the switch 15 and the reception output terminal 130 and/or a low noise amplifier that is connected between the switch 15 and the reception output terminal 140.

Some of the circuit elements illustrated in FIG. 1 do not have to be included in the high-frequency circuit 1. For example, the high-frequency circuit 1 may include at least the diplexer 10, the notch filters 21 and 31, and the switches 14 and 15, and does not have to include other circuit elements.

Further, the diplexer 10, the notch filters 21 and 31, and the switches 13 to 15 may be arranged on one substrate or in one package.

[1.1.3 Circuit Configuration of High-Frequency Circuit 6]

A circuit configuration example of the high-frequency circuit 6 will now be described. As illustrated in FIG. 1, the high-frequency circuit 6 includes duplexers 71, 72, and 81, a filter 82, switches 63, 64, 65, and 66, power amplifiers 75 and 85, transmission input terminals 210 and 240, and reception output terminals 220, 230, 250 and 260. The high-frequency circuit 6 is a circuit that transmits a signal of a communication band belonging to the second frequency band group.

The duplexer 71 uses, for example, the band B3 of the middle-high band as a pass band. The duplexer 71 includes a common terminal, a transmission terminal, and a reception terminal. The common terminal is connected with the switch 63, the transmission terminal is connected with the switch 64, and the reception terminal is connected with the reception output terminal 220.

The duplexer 72 uses, for example, the band B1 of the middle-high band as a pass band. The duplexer 72 includes a common terminal, a transmission terminal, and a reception terminal. The common terminal is connected with the switch 63, the transmission terminal is connected with the switch 64, and the reception terminal is connected with the reception output terminal 230.

The duplexer 81 uses, for example, the band B7 of the middle-high band as a pass band. The duplexer 81 includes a common terminal, a transmission terminal, and a reception terminal. The common terminal is connected with the switch 63, the transmission terminal is connected with the switch 65, and the reception terminal is connected with the reception output terminal 250.

The filter 82 uses, for example, the band B41 of the middle-high band as a pass band. One terminal of the filter 82 is connected with the switch 63 and the other terminal of the filter 82 is connected with the switches 65 and 66.

The switch 63 is connected between the filter 12 and the duplexers 71, 72, and 81 and between the filter 12 and the filter 82. The switch 63 switches connection and disconnection between the filter 12 and the duplexer 71, connection and disconnection between the filter 12 and the duplexer 72, connection and disconnection between the filter 12 and the duplexer 81, and connection and disconnection between the filter 12 and the filter 82.

The power amplifier 75 is connected between the switch 64 and the transmission input terminal 210. The power amplifier 75 is capable of amplifying a transmission signal of the band B3 or the band B1 received in the transmission input terminal 210.

The power amplifier 85 is connected between the switch 65 and the transmission input terminal 240. The power amplifier 85 is capable of amplifying a transmission signal of the band B7 or the band B41 received in the transmission input terminal 240.

For example, multi-stage amplifiers and/or differential amplifiers can be used as the power amplifiers 75 and 85, but the power amplifiers 75 and 85 are not limited to these.

The switch 64 is connected between a transmission filter of the duplexer 71 and the power amplifier 75 and connected between a transmission filter of the duplexer 72 and the power amplifier 75.

In this connection configuration, the switch 64 switches connection and disconnection between the transmission filter of the duplexer 71 and the power amplifier 75 and switches connection and disconnection between the transmission filter of the duplexer 72 and the power amplifier 75 in response to, for example, a control signal from the RFIC 3.

The switch 65 is connected between a transmission filter of the duplexer 81 and the power amplifier 85 and connected between the filter 82 and the power amplifier 85.

In this connection configuration, the switch 65 switches connection and disconnection between the transmission filter of the duplexer 81 and the power amplifier 85 and switches connection and disconnection between the filter 82 and the power amplifier 85 in response to, for example, a control signal from the RFIC 3.

The switch 66 is connected between the filter 82 and the reception output terminal 260.

In this connection configuration, the switch 66 switches connection and disconnection between the filter 82 and the reception output terminal 260 in response to, for example, a control signal from the RFIC 3.

Here, the high-frequency circuit 6 may include a low noise amplifier that is connected between a reception filter of the duplexer 71 and the reception output terminal 220, a low noise amplifier that is connected between a reception filter of the duplexer 72 and the reception output terminal 230, a low noise amplifier that is connected between a reception filter of the duplexer 81 and the reception output terminal 250, and/or a low noise amplifier that is connected between the switch 66 and the reception output terminal 260.

Here, the high-frequency circuit 6 does not have to include the circuit elements illustrated in FIG. 1, and may be any circuit as long as the circuit transmits a signal of the second frequency band group.

[1.1.4 Circuit Configurations of Notch Filters 21 and 31]

Description will now be provided on circuit configuration examples of the notch filters 21 and 31 included in the high-frequency circuit 1.

Figure 2:
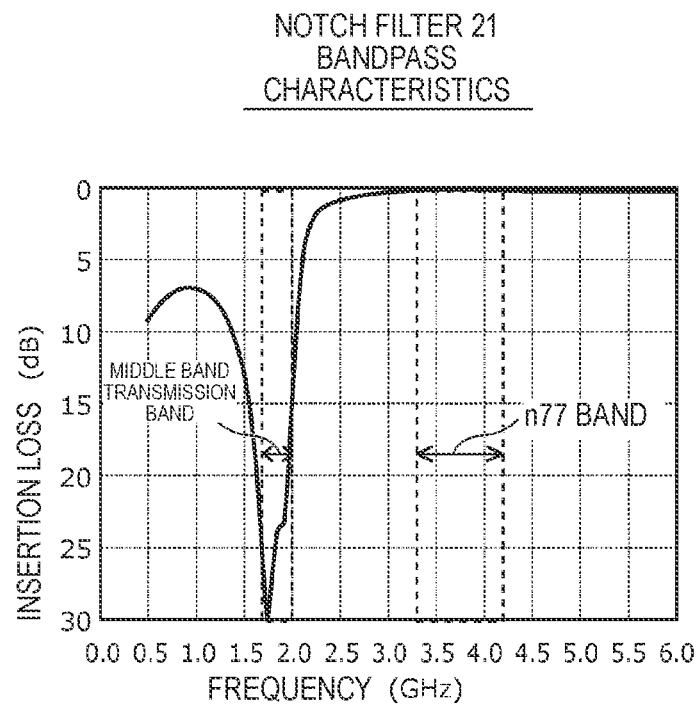
FIG. 2 is a graph showing bandpass characteristics of a first band rejection filter according to the first embodiment.

FIG. 2 is a graph showing bandpass characteristics of the notch filter 21 according to the first embodiment. As illustrated in the drawing, the notch filter 21 uses the transmission bands of the bands B3 and B1 of the middle-high band as stop bands and uses the band n77 of the ultra-high band as a pass band. Here, frequencies of second harmonic waves in the transmission bands of the bands B3 and B1 are included in the band of the band n77. According to the above-described bandpass characteristics of the notch filter 21, second harmonic waves in the transmission bands of the bands B3 and B1 flow into the reception path of the high-frequency circuit 1 from the transmission path of the high-frequency circuit 6, accordingly being able to suppress deterioration in reception sensitivity. Further, the second harmonic waves overlap with a transmission signal of the high-frequency circuit 1, accordingly being able to suppress deterioration in signal quality of the transmission signal.

Here, the stop band of the notch filter 21 may be the band n79 in the ultra-high band. This can reduce mutual interference between a signal of the band n77 and a signal of the band n79.

Figure 3:
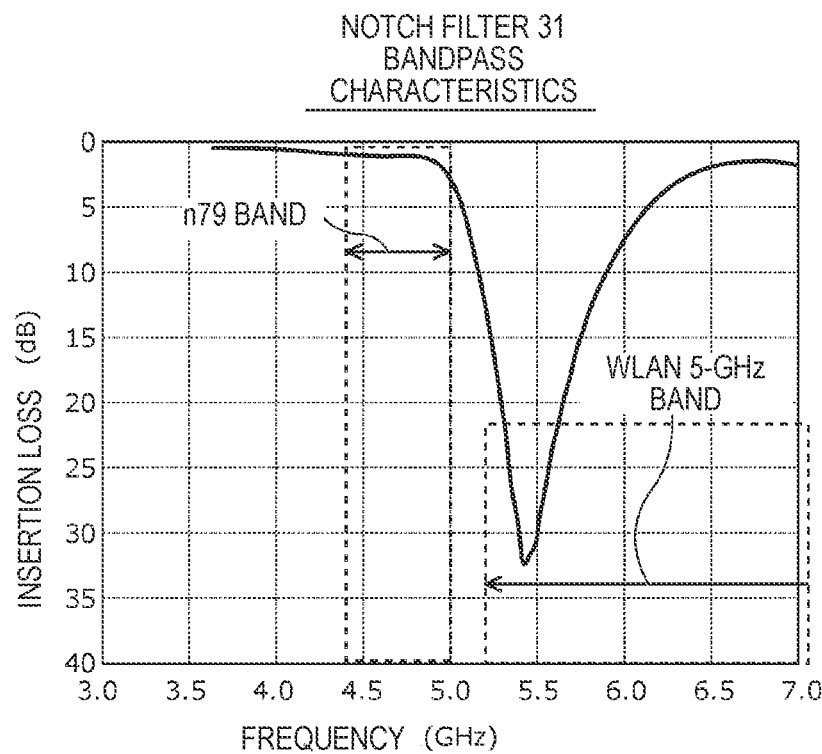
FIG. 3 is a graph showing bandpass characteristics of a second band rejection filter according to the first embodiment.

FIG. 3 is a graph showing bandpass characteristics of a second band rejection filter according to the first embodiment. As illustrated in the drawing, the notch filter 31 uses a part of a WLAN 5-GHz band as a stop band and uses the band n79 of the ultra-high band as a pass band. Here, the WLAN 5-GHz band is located close to the higher frequency side of the band n79. According to the above-described bandpass characteristics of the notch filter 31, a signal of the WLAN 5-GHz band flows into the reception path of the high-frequency circuit 1, accordingly being able to suppress deterioration in reception sensitivity. Further, the signal of the WLAN 5-GHz band overlaps with a transmission signal of the high-frequency circuit 1, accordingly being able to suppress deterioration in signal quality of the transmission signal.

Here, the stop band of the notch filter 31 may be the band n77 in the ultra-high band. This can reduce mutual interference between a signal of the band n77 and a signal of the band n79.

[1.2 Circuit Configurations of High-Frequency Circuit 501 and Communication Device 505 According to Comparative Example]

Figure 4:
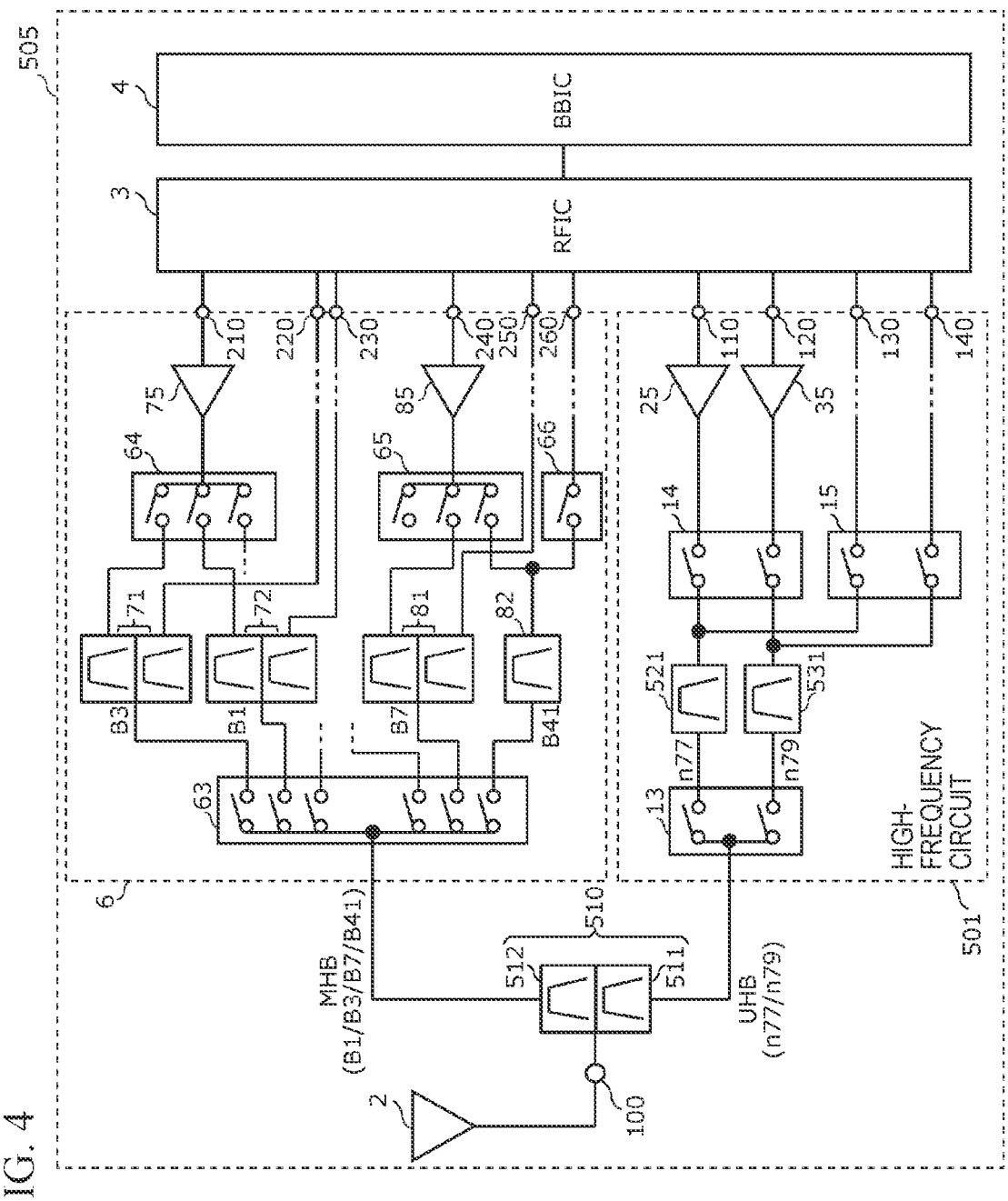
FIG. 4 is a circuit configuration diagram of a high-frequency circuit and a communication device according to a comparative example.

The circuit configurations of a high-frequency circuit 501 and a communication device 505 according to a comparative example will be described with reference to FIG. 4. FIG. 4 is a circuit configuration diagram of the high-frequency circuit 501 and the communication device 505 according to the comparative example. As illustrated in FIG. 4, the communication device 505 according to the comparative example includes the high-frequency circuits 501 and 6, a diplexer 510, the antenna 2, the RFIC 3, and the BBIC 4.

The diplexer 510 includes filters 511 and 512. The filter 511 is a filter that has a pass band including a first frequency band group. The first frequency band group includes the first communication band for TDD and the second communication band for TDD. The filter 512 is a filter that has a pass band including a second frequency band group whose frequency does not overlap with the frequency of the first frequency band group.

One terminal of the filter 511 and one terminal of the filter 512 are connected with the antenna connection terminal 100. The other terminal of the filter 511 is connected with the switch 13 of the high-frequency circuit 501. The other terminal of the filter 512 is connected with the switch 63 of the high-frequency circuit 6.

The communication device 505 according to the comparative example is different from the communication device 5 according to the first embodiment in the configuration of the high-frequency circuit 501. The communication device 505 according to the comparative example will be described below focusing on the difference between the high-frequency circuit 501 and the high-frequency circuit 1.

The high-frequency circuit 501 includes band pass filters 521 and 531, the switches 13, 14, and 15, the power amplifiers 25 and 35, the transmission input terminals 110 and 120, and the reception output terminals 130 and 140. The high-frequency circuit 501 according to the comparative example is different from the high-frequency circuit 1 according to the first embodiment in that the high-frequency circuit 501 does not include the diplexer 510 and includes the band pass filters 521 and 531 instead of the notch filters 21 and 31. The following description of the high-frequency circuit 501 according to the comparative example will focus on the different points, omitting the description of the points that are the same as those of the high-frequency circuit 1.

The band pass filter 521 is connected with the filter 511 via the switch 13. The band pass filter 521 is a band pass filter that uses the first communication band as a pass band and uses both of a band on the lower frequency side than the first communication band and a band on the higher frequency side than the first communication band as attenuation bands.

The band pass filter 521 is, for example, a ladder-type acoustic wave filter or a longitudinally-coupled acoustic wave filter that is composed of acoustic wave resonators arranged on a serial arm path and a parallel arm path, or an LC filter that is composed of an inductor and a capacitor arranged on a serial arm path and a parallel arm path.

The band pass filter 531 is connected with the filter 511 via the switch 13. The band pass filter 531 is a band rejection filter that uses the second communication band as a pass band and uses both of a band on the lower frequency side than the second communication band and a band on the higher frequency side than the second communication band as attenuation bands.

The band pass filter 531 is, for example, a ladder-type acoustic wave filter or a longitudinally-coupled acoustic wave filter that is composed of acoustic wave resonators arranged on a serial arm path and a parallel arm path, or an LC filter that is composed of an inductor and a capacitor arranged on a serial arm path and a parallel arm path.

[1.3 Effects, Etc.]

As described above, the high-frequency circuit 1 according to the present embodiment includes: the diplexer 10 that is composed of the filter 11 which has a pass band including the first frequency band group which includes the first communication band for TDD and the second communication band for TDD and the filter 12 which has a pass band including the second frequency band group whose frequency does not overlap with the frequency of the first frequency band group; the notch filter 21 that is connected with the filter 11 and whose stop band is a frequency band which is not included in the first communication band; the notch filter 31 that is connected with the filter 12 and whose stop band is a frequency band which is not included in the second communication band; and the switches 14 and 15 that are connected between the notch filter 21 and the transmission input terminal 110 and between the notch filter 21 and the reception output terminal 130 and are connected between the notch filter 31 and the transmission input terminal 120 and between the notch filter 31 and the reception output terminal 140. A band pass filter whose pass band is the first communication band and a band pass filter whose pass band is the second communication band are not connected between the filter 11 and the switches 14 and 15.

When transmitting signals of the first communication band and the second communication band for TDD with low loss in the high-frequency circuit 501 and the communication device 505 according to the comparative example, the high-frequency circuit 501 and the communication device 505 employ the arrangement including the diplexer 510, which divides or combines a signal of the first frequency band group to which these plurality of TDD bands belong and a signal of another frequency band group, the band pass filter 521 whose pass band is the first communication band, and the band pass filter 531 whose pass band is the second communication band. However, pass bands and attenuation characteristics are partially overlapped with each other between the filter 511 constituting the diplexer 510 and the band pass filter 521 whose pass band is the first communication band which is a broadband and between the filter 511 and the band pass filter 531 whose pass band is the second communication band which is a broadband. Further, the circuit configurations of the two band pass filters 521 and 531 are complex and increased in size.

On the other hand, in the high-frequency circuit 1 according to the present embodiment, the notch filter 21 is arranged instead of the band pass filter 521 whose pass band is the first communication band, and the notch filter 31 is arranged instead of the band pass filter 531 whose pass band is the second communication band. This can simplify the circuit configuration of filters that are arranged between the filter 11 and the switches 14 and 15 and can reduce insertion loss in a pass band which is other than a stop band, being able to transmit the signal of the first communication band and the signal of the second communication band with low loss. Thus, the high-frequency circuit 1 that is simplified and reduced in size and that is capable of transmitting signals of a plurality of mutually-different TDD bands with low loss can be provided.

Further, for example, the diplexer 10, the notch filters 21 and 31, and the switches 14 and 15 may be arranged on one substrate or in one package in the high-frequency circuit 1 according to the present embodiment.

In this configuration, the high-frequency circuit 1 can be reduced in size and the diplexer 10 is arranged close to the circuit transmitting the signal of the first frequency band group, being able to transmit the signal of the first communication band for TDD and the signal of the second communication band for TDD with low loss.

Also, for example, in the high-frequency circuit 1 according to the present embodiment, the filter 11 may be one of a low-pass LC filter and a high-pass LC filter and the filter 12 may be the other of a low-pass LC filter and a high-pass LC filter.

The diplexer 10 can be thus composed of simplified LC filters and accordingly, the high-frequency circuit 1 can be further simplified and reduced in size.

For example, the high-frequency circuit 1 according to the present embodiment may further include the switch 13 that switches connection and disconnection between the filter 11 and the notch filter 21 and switches connection and disconnection between the filter 11 and the notch filter 31.

This configuration can improve isolation between signal transmission of the first communication band and signal transmission of the second communication band.

For example, the high-frequency circuit 1 according to the present embodiment may further include the power amplifier 25 that is connected between the switches 14 and 15 and the transmission input terminal 110, and the power amplifier 35 that is connected between the switches 14 and 15 and the transmission input terminal 120.

The high-frequency circuit 1 thus includes the power amplifiers 25 and 35, being able to shorten the transmission path of the first communication band and the transmission path of the second communication band. This configuration makes it possible to transmit the transmission signal of the first communication band and the transmission signal of the second communication band with low loss.

Further, for example, the first communication band may be the band n77 for 5GNR and the second communication band may be the band n79 for 5GNR, in the high-frequency circuit 1 according to the present embodiment.

The communication device 5 according to the present embodiment includes the RFIC 3 that processes a high-frequency signal and the high-frequency circuit 1 that transmits a high-frequency signal between the RFIC 3 and the antenna 2.

Accordingly, the communication device 5 can achieve the same effects as those described above of the high-frequency circuit 1.

The notch filters 21 and 31 and the switches 13 to 15 are respectively configured as separate components in the present embodiment, but these are not limited to this. Part of the notch filters 21 and 31 and some or all of the switches 13 to 15 may be incorporated in one or more semiconductor integrated circuits. Semiconductor integrated circuits are an electronic circuit that is formed on a surface or in the inside of a semiconductor chip (also called die) and is also called a semiconductor component. Semiconductor integrated circuits may be made, for example, of complementary metal oxide semiconductor (CMOS) and specifically, may be formed by a silicon on insulator (SOI) process. Accordingly, semiconductor integrated circuits can be manufactured inexpensively. Here, semiconductor integrated circuits may be made of at least one of GaAs, SiGe, and GaN. Semiconductor integrated circuits with high quality can be thus realized.

The filters 11 and 12 constitute the diplexer 10 in the present embodiment, but these are not limited to this. For example, the filters 11 and 12 may be separate filter components that are respectively connected with separate terminals of a switch connected to the antenna connection terminal 100.

Second Embodiment

A second embodiment will now be described. The present embodiment is mainly different from the above-described first embodiment in that a high-frequency circuit 7 includes two diplexers 90 and 95 in the present embodiment. The high-frequency circuit 7 and a communication device 8 according to the present embodiment will be described focusing on the difference from the above-described first embodiment with reference to the accompanying drawing.

[2.1 Circuit Configurations of High-Frequency Circuit 7 and Communication Device 8]

Figure 5:
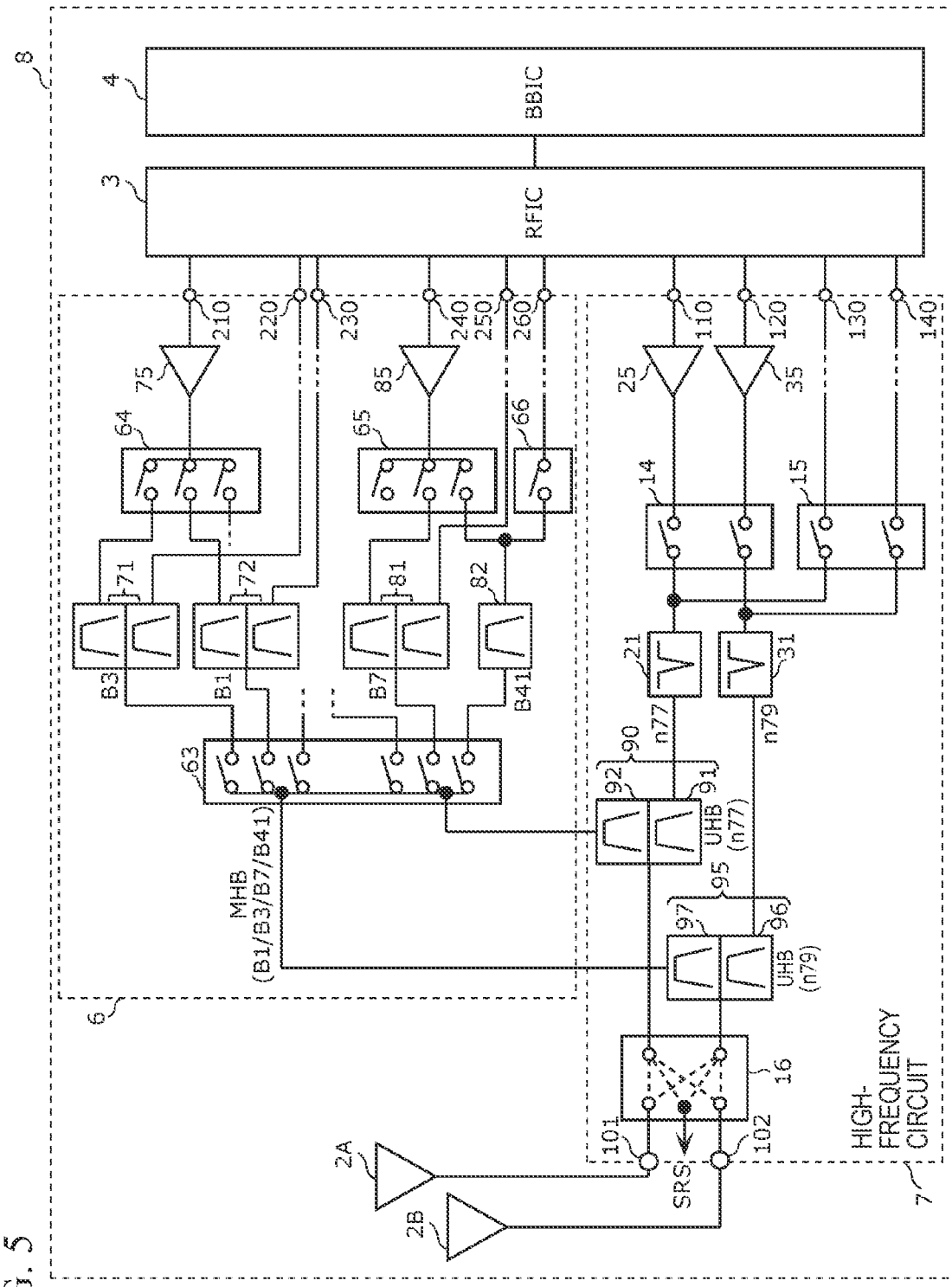
FIG. 5 is a circuit configuration diagram of a high-frequency circuit and a communication device according to a second embodiment.

Circuit configurations of the high-frequency circuit 7 and the communication device 8 according to the present embodiment will be described with reference to FIG. 5. FIG. 5 is a circuit configuration diagram of the high-frequency circuit 7 and the communication device 8 according to the second embodiment.

[2.1.1 Circuit Configuration of Communication Device 8]

The circuit configuration of the communication device 8 will be first described. As illustrated in FIG. 5, the communication device 8 according to the present embodiment includes the high-frequency circuits 7 and 6, antennas 2A and 2B, the RFIC 3, and the BBIC 4.

The high-frequency circuits 7 and 6 transmit high-frequency signals between the antennas 2A and 2B and the RFIC 3. The circuit configuration of the high-frequency circuit 7 will be detailed later.

The antenna 2A is an example of a first antenna and is connected with an antenna connection terminal 101 of the high-frequency circuit 7. The antenna 2A transmits a high-frequency signal outputted from the high-frequency circuit 7, and also receives a high-frequency signal from the outside and outputs the high-frequency signal to the high-frequency circuit 7. The antenna 2B is an example of a second antenna and is connected with an antenna connection terminal 102 of the high-frequency circuit 7. The antenna 2B transmits a high-frequency signal outputted from the high-frequency circuit 7, and also receives a high-frequency signal from the outside and outputs the high-frequency signal to the high-frequency circuit 7.

In the communication device 8 according to the present embodiment, the antennas 2A and 2B, the high-frequency circuit 6, and the BBIC 4 are optional components.

[2.1.2 Circuit Configuration of High-Frequency Circuit 7]

The circuit configuration of the high-frequency circuit 7 will now be described. As illustrated in FIG. 5, the high-frequency circuit 7 includes the diplexers 90 and 95, the notch filters 21 and 31, switches 13, 14, 15, and 16, the power amplifiers 25 and 35, the antenna connection terminals 101 and 102, the transmission input terminals 110 and 120, and the reception output terminals 130 and 140.

The antenna connection terminal 101 is connected with the antenna 2A and the antenna connection terminal 102 is connected with the antenna 2B.

The diplexer 90 is an example of a second multiplexer and includes filters 91 and 92. The filter 91 is an example of a third filter and is a filter that has a pass band including the first communication band of the first communication band for TDD and the second communication band for TDD. The first communication band and the second communication band are included in the first frequency band group. The filter 92 is an example of a fourth filter and is a filter that has a pass band including a second frequency band group whose frequency does not overlap with those of the first communication band and the second communication band.

One terminal of the filter 91 and one terminal of the filter 92 are connected with the antenna connection terminal 101 or 102 via the switch 16. The other terminal of the filter 91 is connected with the notch filter 21. The other terminal of the filter 92 is connected with the switch 63 of the high-frequency circuit 6.

The diplexer 95 is an example of a third multiplexer and includes filters 96 and 97. The filter 96 is an example of a fifth filter and is a filter that has a pass band including the second communication band of the first communication band for TDD and the second communication band for TDD. The filter 97 is an example of a sixth filter and is a filter that has a pass band including a second frequency band group whose frequency does not overlap with those of the first communication band and the second communication band.

One terminal of the filter 96 and one terminal of the filter 97 are connected with the antenna connection terminal 101 or 102 via the switch 16. The other terminal of the filter 96 is connected with the notch filter 31. The other terminal of the filter 97 is connected with the switch 63 of the high-frequency circuit 6.

In the present embodiment, the first frequency band group is, for example, an ultra-high band (3.3 to 5 GHz) and includes the bands n77 and n79 for 5GNR. The second frequency band group is, for example, a middle-high band (1.5 to 2.8 GHz) and includes the band B1, band B3, band B7, and band B41 for 4GLTE.

The filters 91 and 96 are, for example, high-pass LC filters including an ultra-high band as a pass band, and the filters 92 and 97 are, for example, low-pass LC filters including a middle-high band as a pass band. When the first frequency band group is located on a lower frequency side than the second frequency band group, the filters 91 and 96 may be low-pass LC filters and the filters 92 and 97 may be high-pass LC filters.

The notch filter 21 is an example of a third band rejection filter. The notch filter 21 is a band rejection filter that is connected with the filter 91 and whose stop band is a frequency band which is not included in the first communication band. Further, the notch filter 21 uses a band on the lower frequency side and a band on the higher frequency side than the stop band as pass bands.

The notch filter 21 is, for example, an acoustic wave notch filter that is composed only of an acoustic wave resonator arranged on a serial arm path or a parallel arm path, or an LC filter that is composed only of an LC resonance circuit arranged on a parallel arm path. Here, the third band rejection filter may be a high-pass LC filter, or may be a low-pass LC filter, instead of the notch filter 21. The high-pass LC filter uses a frequency band on the lower frequency side than the first communication band as an attenuation band and uses the first communication band as a pass band. The low-pass LC filter uses a frequency band on the higher frequency side than the first communication band as an attenuation band and uses the first communication band as a pass band.

The notch filter 31 is an example of a fourth band rejection filter. The notch filter 31 is a band rejection filter that is connected with the filter 96 and whose stop band is a frequency band which is not included in the second communication band. Further, the notch filter 31 uses a band on the lower frequency side and a band on the higher frequency side than the stop band as pass bands.

The notch filter 31 is, for example, an acoustic wave notch filter that is composed only of an acoustic wave resonator arranged on a serial arm path or a parallel arm path, or an LC filter that is composed only of an LC resonance circuit arranged on a parallel arm path. Here, the fourth band rejection filter may be a high-pass LC filter, or may be a low-pass LC filter, instead of the notch filter 31. The high-pass LC filter uses a frequency band on the lower frequency side than the second communication band as an attenuation band and uses the second communication band as a pass band. The low-pass LC filter uses a frequency band on the higher frequency side than the second communication band as an attenuation band and uses the second communication band as a pass band.

The switch 16 is an example of a third switching circuit. The switch 16 switches connection and disconnection between one of the antennas 2A and 2B and the diplexer 90 and switches connection and disconnection between the other of the antennas 2A and 2B and the diplexer 95.

In this connection configuration, the switch 16 can switch connection and disconnection between either one of the antennas 2A and 2B and either one of the diplexers 90 and 95 in response to, for example, a control signal from the RFIC 3.

The switch 16 has a terminal that outputs a sounding reference signal (SRS). An SRS is a signal for informing a base station which antenna a mobile terminal outputs a transmission signal with. Accordingly, the communication device 8 can inform a base station by SRSs of information such as which antenna the transmission signal of the first communication band and the transmission signal of the second communication band are transmitted from.

In the high-frequency circuit 7 according to the present embodiment, a band pass filter whose pass band is the first communication band is not connected between the filter 91 and the switches 14 and 15. Further, a band pass filter whose pass band is the second communication band is not connected between the filter 96 and the switches 14 and 15.

Some of the circuit elements illustrated in FIG. 5 do not have to be included in the high-frequency circuit 7. For example, the high-frequency circuit 7 may include at least the diplexers 90 and 95, the notch filters 21 and 31, and the switches 14 to 16, and does not have to include other circuit elements.

Further, the diplexers 90 and 95, the notch filters 21 and 31, and the switches 14 to 16 may be arranged on one substrate or in one package.

[2.2 Effects, Etc.]

As described above, the high-frequency circuit 7 according to the present embodiment includes: the diplexer 90 that is composed of the filter 91 which has a pass band including the first communication band of the first communication band for TDD and the second communication band for TDD and the filter 92 which has a pass band including the second frequency band group whose frequency does not overlap with the frequencies of the first communication band and the second communication band; the diplexer 95 that is composed of the filter 96 which has a pass band including the second communication band and the filter 97 which has a pass band including the second frequency band group; the notch filter 21 that is connected with the filter 91 and whose stop band is a frequency band which is not included in the first communication band; the notch filter 31 that is connected with the filter 96 and whose stop band is a frequency band which is not included in the second communication band; the switches 14 and 15 that are connected between the notch filter 21 and the transmission input terminal 110 and between the notch filter 21 and the reception output terminal 130 and are connected between the notch filter 31 and the transmission input terminal 120 and between the notch filter 31 and the reception output terminal 140; and the switch 16 that switches connection and disconnection between one of the antennas 2A and 2B and the diplexer 90 and switches connection and disconnection between the other of the antennas 2A and 2B and the diplexer 95. A band pass filter whose pass band is the first communication band is not connected between the filter 91 and the switches 14 and 15, and a band pass filter whose pass band is the second communication band is not connected between the filter 96 and the switches 14 and 15.

According to the above-described configuration, the notch filter 21 is arranged instead of the band pass filter whose pass band is the first communication band, and the notch filter 31 is arranged instead of the band pass filter whose pass band is the second communication band. This can simplify the circuit configuration of filters that are arranged between the filter 91 and the switches 14 and 15, can simplify the circuit configuration of filters that are arranged between the filter 96 and the switches 14 and 15, and can reduce insertion loss in a pass band which is other than a stop band, being able to transmit the signal of the first communication band and the signal of the second communication band with low loss. Thus, the high-frequency circuit 7 that is simplified and reduced in size and that is capable of transmitting signals of a plurality of mutually-different TDD bands with low loss can be provided.

Further, for example, the diplexers 90 and 95, the notch filters 21 and 31, and the switches 14 to 16 may be arranged on one substrate or in one package in the high-frequency circuit 7 according to the present embodiment.

In this configuration, the high-frequency circuit 7 can be reduced in size and the diplexers 90 and 95 are arranged close to the circuit transmitting the signal of the first frequency band group, being able to transmit the signal of the first communication band for TDD and the signal of the second communication band for TDD with low loss.

Also, for example, in the high-frequency circuit 7 according to the present embodiment, each of the filters 91 and 96 may be one of a low-pass LC filter and a high-pass LC filter and each of the filters 92 and 97 may be the other of a low-pass LC filter and a high-pass LC filter.

The diplexers 90 and 95 can be thus composed of simplified LC filters and accordingly, the high-frequency circuit 7 can be further simplified and reduced in size.

Other Embodiments

The high-frequency circuits and communication devices according to the present disclosure have been described above based on the first and second embodiments. However, the high-frequency circuits and communication devices according to the present disclosure are not limited to the above-described embodiments. The disclosure also includes other embodiments realized by combining any of the components in the above-described embodiments, modifications obtained by making various changes, which a person skilled in the art can think of, to the above-described embodiments P necessarily departing from the scope of the present disclosure, and various devices incorporating the above-described high-frequency circuits and communication devices.

For example, in the circuit configurations of the high-frequency circuits and the communication devices according to the above-described embodiments, another circuit element, wiring, and the like may be inserted between the paths connecting the circuit elements and signal paths illustrated in each drawing.

INDUSTRIAL APPLICABILITY

The present disclosure is widely applicable to communication devices, such as mobile phones, as a high-frequency circuit arranged in a front end portion.

REFERENCE SIGNS LIST 1, 6, 7, 501 high-frequency circuit
2, 2A, 2B antenna
3 RF signal processing circuit (RFIC)
4 baseband signal processing circuit (BBIC)
5, 8, 505 communication device
10, 90, 95, 510 diplexer
11, 12, 82, 91, 92, 96, 97, 511, 512 filter
13, 14, 15, 16, 63, 64, 65, 66 switch
21, 31 notch filter
25, 35, 75, 85 power amplifier
71, 72, 81 duplexer
100, 101, 102 antenna connection terminal
110, 120, 210, 240 transmission input terminal
130, 140, 220, 230, 250, 260 reception output terminal
521, 531 band pass filter

The invention claimed is:

1. A high-frequency circuit comprising:
a first multiplexer comprising:
a first filter having a pass band comprising a first frequency band group, the first frequency band group comprising a first communication band for time division duplex (TDD) communication and a second communication band for TDD communication, and
a second filter having a pass band comprising a second frequency band group, wherein frequencies of the second frequency band group do not overlap frequencies of the first frequency band group;
a first band rejection filter that is connected to the first filter and that has a stop band that is not in the first communication band;
a second band rejection filter that is connected to the first filter and that has a stop band that is not in the second communication band; and a first switching circuit that is connected between the first band rejection filter and a first transmission input terminal and between the first band rejection filter and a first reception output terminal, and is connected between the second band rejection filter and a second transmission input terminal and between the second band rejection filter and a second reception output terminal, wherein the first and second transmission input terminals are configured to receive first and second transmission signals, respectively, wherein the first and second reception output terminals are configured to output first and second reception signals, respectively, and wherein a first band pass filter having a pass band comprising the first communication band and a second band pass filter having pass band comprising the second communication band are not connected between the first filter and the first switching circuit.

2. The high-frequency circuit according to claim 1, wherein the first multiplexer, the first band rejection filter, the second band rejection filter, and the first switching circuit are physically arranged on one substrate or in one package.

3. The high-frequency circuit according to claim 1, wherein the first filter is one of a low-pass LC filter and a high-pass LC filter, and
wherein the second filter is the other of the low-pass LC filter and the high-pass LC filter.

4. The high-frequency circuit according to claim 1, further comprising:
a second switching circuit configured to selectively connect the first filter to the first band rejection filter, and to selectively connect the first filter to the second band rejection filter.

5. The high-frequency circuit according to claim 1, further comprising:
a first power amplifier that is connected between the first switching circuit and the first transmission input terminal; and
a second power amplifier that is connected between the first switching circuit and the second transmission input terminal.

6. The high-frequency circuit according to claim 1, wherein the first communication band is band n77 for 5th generation new radio (5GNR), and
wherein the second communication band is band n79 for 5GNR.

7. A high-frequency circuit comprising:
a second multiplexer comprising:
a third filter having a pass band comprising a first communication band for time division duplex (TDD) communication and a second communication band for TDD communication, and
a fourth filter having a pass band comprising a second frequency band group, wherein frequencies of the second frequency band group do not overlap the first communication band and do not overlap the second communication band;
a third multiplexer comprising:
a fifth filter having a pass band comprising the second communication band, and
a sixth filter having a pass band comprising frequencies of the second frequency band group;
a third band rejection filter that is connected to the third filter and that has stop band that is not in the first communication band;
a fourth band rejection filter that is connected to the fifth filter and that has a stop band that is not in the second communication band;
a first switching circuit that is connected between the third band rejection filter and a first transmission input terminal and between the third band rejection filter and a first reception output terminal, and is connected between the fourth band rejection filter and a second transmission input terminal and between the fourth band rejection filter and a second reception output terminal; and
a third switching circuit configured to selectively connect one of a first antenna and a second antenna to the second multiplexer, and selectively connect the other of the first antenna and the second antenna to the third multiplexer, wherein the first and second transmission input terminals are configured to receive first and second transmission signals, respectively, wherein the first and second reception output terminals are configured to output first and second reception signals, respectively, wherein a first band pass filter having a pass band comprising the first communication band is not connected between the third filter and the first switching circuit, and
wherein a second band pass filter having a pass band comprising the second communication band is not connected between the fifth filter and the first switching circuit.

8. The high-frequency circuit according to claim 7, wherein the second multiplexer, the third multiplexer, the third band rejection filter, the fourth band rejection filter, the first switching circuit, and the third switching circuit are physically arranged on one substrate or in one package.

9. The high-frequency circuit according to claim 7, wherein each of the third filter and the fifth filter is one of a low-pass LC filter and a high-pass LC filter, and
wherein each of the fourth filter and the sixth filter is the other of the low-pass LC filter and the high-pass LC filter.

10. The high-frequency circuit according to claim 7, further comprising:
a first power amplifier that is connected between the first switching circuit and the first transmission input terminal; and
a second power amplifier that is connected between the first switching circuit and the second transmission input terminal.

11. The high-frequency circuit according to claim 7, wherein the first communication band is band n77 for 5th generation new radio (5GNR), and
wherein the second communication band is band n79 for 5GNR.

12. A communication device comprising:
a signal processing circuit configured to process a high-frequency signal; and
the high-frequency circuit according to claim 1 configured to transmit the high-frequency signal between the signal processing circuit and an antenna.

13. A communication device comprising:
a signal processing circuit configured to process a high-frequency signal; and
the high-frequency circuit according to claim 7 configured to transmit the high-frequency signal between the signal processing circuit and the first or second antenna.

* * * * *